(12) United States Patent
Hashimoto

(10) Patent No.: US 6,514,823 B2
(45) Date of Patent: Feb. 4, 2003

(54) METHOD OF MAKING LOADLESS FOUR-TRANSISTOR MEMORY CELL WITH DIFFERENT GATE INSULATION THICKNESSES FOR N-CHANNEL DRIVE TRANSISTORS AND P-CHANNEL ACCESS TRANSISTORS

(75) Inventor: Shingo Hashimoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/212,658

(22) Filed: Aug. 5, 2002

(65) Prior Publication Data

US 2002/0185663 A1 Dec. 12, 2002

Related U.S. Application Data

(62) Division of application No. 09/894,177, filed on Jun. 27, 2001, now Pat. No. 6,442,062.

(30) Foreign Application Priority Data

Jun. 29, 2000 (JP) ........................................ 2000-196175

(51) Int. Cl.⁷ .......................................... H01L 21/8234
(52) U.S. Cl. ........................ 438/275; 438/279; 438/238

(58) Field of Search ................................. 438/275, 279, 438/238, 199

(56) References Cited

U.S. PATENT DOCUMENTS

| 5,285,096 A | 2/1994 | Ando et al. .................. 257/379 |
| 5,327,002 A | 7/1994 | Motoyoshi .................. 257/380 |
| 6,442,061 B1 * | 8/2002 | Kong et al. .................. 365/154 |

FOREIGN PATENT DOCUMENTS

| JP | 6-104405 | 4/1994 | ......... H01L/27/11 |
| JP | 7-302847 | 11/1995 | ....... H01L/21/8244 |
| JP | 10-109261 | * 4/1998 | ........... B24B/29/00 |

* cited by examiner

Primary Examiner—Andrew Q. Tran
(74) Attorney, Agent, or Firm—Katten Muchin Zavis Rosenman

(57) ABSTRACT

A memory cell has a pair of n-ch drive MOS transistors, a pair of p-ch access MOS transistors. The access MOS transistor supply electric charge to storage nodes of the drive MOS transistors without using a resistive load. The gate insulation films of the drive MOS transistors have a thickness lower than the thickness of the gate insulation films of the access MOS transistors for achieving stable and high-speed operation of the memory cell.

4 Claims, 13 Drawing Sheets ic silicon film.
METHOD OF MAKING LOADLESS FOUR-TRANSISTOR MEMORY CELL WITH DIFFERENT GATE INSULATION THICKNESSES FOR N-CHANNEL DRIVE TRANSISTORS AND P-CHANNEL ACCESS TRANSISTORS

CROSS REFERENCE TO RELATED APPLICATION

This application is a Divisional Application of Application Ser. No. 09/894,177, filed on Jun. 27, 2001, now U.S. Pat. No. 6,442,062.

BACKGROUND OF THE INVENTION (a) Field of the Invention

The present invention relates to a load-less four-transistor memory cell and a method for fabricating the same. More particularly, the present invention relates to a memory cell in a semiconductor memory device which is capable of realizing a stable and high-speed memory cell operation, and which can be suitably used as a SRAM (Static Random Access Memory).

(b) Description of the Related Art

Semiconductor memory devices are generally classified into three types including DRAMs (Dynamic Random Access Memories), SRAMs, and ROMs (Read Only Memories).

In a DRAM, each memory cell is composed of two elements, i.e., a MIS (Metal Insulator Semiconductor) transistor, such as MOS (Metal Oxide Semiconductor) transistor, and a storage capacitor. Therefore, a DRAM has advantages such as a high degree of integration and a high cost performance.

A SRAM, on the other hand, has advantages such as a high operating speed and a lower power dissipation as compared to the DRAM. However, in a SRAM, each memory cell is typically composed of six transistors, or four transistors and two resistive loads. Thus, it has be considered that a SRAM is not suitable for realizing a high degree of integration due to such a large number of elements per memory cell.

Basically, a SRAM includes a flip flop circuit or latch circuit and a pair of access transistors connected to the flip flop circuit, and the flip flop circuit is typically a combination of two inverter circuits connected in a positive feedback loop.

An inverter circuit can be obtained as either a combination of an N-channel MOS transistor (referred to as an "NMOS transistor") and a P-channel MOS transistor (referred to as a "PMOS transistor"), or a combination of an NMOS transistor and a resistive load.

A memory cell of a SRAM including six transistors is called a "full-CMOS memory cell" because the transistors are CMOS transistors, and is called herein full-CMOS six-transistor memory cell. This type of SRAM is the largest among various types of SRAMs in terms of the area occupied by a single memory cell.

On the other hand, a memory cell of a SRAM including four transistors and two resistive loads uses MOS transistors while providing the resistive loads above the MOS transistors, thereby reducing the total area to be occupied by the six elements. Therefore, the area required for one memory cell is smaller than that of a six-transistor memory cell, However, production of the memory cell having resistive loads, as compared to that of a six-transistor memory cell, requires additional fabrication steps for forming the resistive loads because the resistive loads are generally formed on a polycrystailine silicon film.

It is also necessary to connect those elements with one another, thereby complicating the structure of the memory cell. Moreover, it is believed that it is more difficult to realize a low-voltage operation by the memory cell having the resistive loads compared to the full-CMOS six-transistor memory cell due to a large time constant of the resistive loads.

In recent years, there is a particular demand in the market for a SRAM capable of operating at a lower source voltage, i.e., at a low power dissipation. Accordingly, full-CMOS memory cells are more widely used than the memory cells having resistive loads despite of their smaller chip area.

Recently, a SRAM using full-CMOS memory cells that only require four transistors and do not have any resistive load was proposed in the art, as described in Japanese Patent Laid-Open Publication Nos. 7-302847 and 6-104405. This type of memory cell is called hereinafter load-less four-transistor memory cell (full-CMOS four transistor) memory cell, or simply four-transistor memory cell.

Such a load-less four-transistor memory cell includes a pair of drive transistors (NMOS transistors) and a pair of access transistors (PMOS transistors), wherein no load element is connected to the storage node of the drive transistor.

The structure and the operation of the conventional six-transistor memory cell and those of the conventional four-transistor memory cell will now be described in detail with reference to FIGS. 1A, 1B, 2A and 2B. FIGS. 1A and 1B are circuit diagrams illustrating the full-CMOS six-transistor memory cell and the load-less four-transistor memory cell, respectively, and FIGS. 2A and 2B are diagrams illustrating the operations of the six-transistor memory cell and the four-transistor memory cell, respectively.

As illustrated in FIG. 1A, the six-transistor memory cell includes a total of six transistors, i.e., a pair of drive transistors Nil and N12 (NMOS transistors), a pair of load transistors P11 and P12 (PMOS transistors), and a pair of access transistors or transfer transistors N13 and N14 (NMOS transistors).

The six-transistor memory cell operates as follows during a data retaining operation or a standby mode. As illustrated in FIG. 2A, the drive transistor Nil and the access transistor N13 are OFF whereas the load transistor P11 is ON to maintain the storage node 11 at a high level, after data "1" is written to the six-transistor memory cell.

In this state, if the load transistor P11 were OFF, the storage node 11 gradually loses its charge, thereby lowering the potential thereof, due to a junction leakage current or a leakage current through the drive transistor N11. The potential of the storage node 11 is maintained at the high level due to the charge by a current flowing from the Vcc source line via the load transistor P11.

When the access transistor N13 is turned ON following the state as described above, a current flows from the storage node 11 to the digit line D11, thereby allowing the stored data to be read out to the digit lines or signal lines.

Next, the configuration and the operation of the load-less four-transistor memory cell will be described. As illustrated in FIG. 1B, the load-less four-transistor memory cell includes a total of four transistors, i.e., a pair of drive transistors N15 and N16 (NMOS transistors), and a pair of access transistors P13 and P14 (PMOS transistors). A major difference between the load-less four-transistor memory cell and the six-transistor memory cell, beside the difference in the number of elements, is that the access transistors P13 and P14 of the load-less four-transistor memory cell are PMOS transistors and supplies leakage current therethrough.

More specifically, the load-less four-transistor memory cell operates as follows during a data retaining operation. As illustrated in FIG. 2B, the drive transistor N15 and the access transistor P13 are OFF when the storage node 13 is at a high level, i.e., after data "1" is written to the load-less four-transistor memory cell.

In this state, without the leakage current through the access transistor P13, as stated in the case of the six-transistor memory cell, the potential of the storage node 13 gradually decreases due to a junction leakage current or a leakage current through the drive transistor N15. While the load-less four-transistor memory cell has no dedicated load element for supplying a current to the storage node 13, the OFF-current (or junction leakage current) of the access transistor P13 flows to the storage node 13 to thereby compensate for the charge loss from the storage node 13

When the access transistor P13 is turned ON after the state as described above, a current flows from the storage node 13 to the digit line D13, thereby allowing the stored data to be read out.

In order for the load-less four-transistor memory cell to operate, it is necessary that the OFF-current (leakage current) of the access transistor P13 or P14 (PMOS transistor) is greater than the OFF-current of the drive transistor N15 or N16 (NMOS transistor).

An advantage of the load-less four-transistor memory cell is that it eliminates the need for providing load elements that are generally connected to the storage nodes of the drive transistors, thereby simplifying the structure of the memory cell.

Next, the structure of the conventional load-less four-transistor memory cell will be described in more detail with reference to FIGS. 3 and 4. FIG. 3 is a top plan view of the conventional load-less four-transistor memory cell, and FIG. 4 is a sectional view of the conventional load-less four-transistor memory cell taken along line A–A' of FIG. 3.

As illustrated in FIG. 4, the conventional load-less four-transistor memory cell includes a pair of drive transistors N15 and N16 having a pair of storage nodes 13 and 14, and a pair of access transistors P13 and P14 for connecting the digit lines D13 and D14 to the storage nodes 13 and 14.

The drain of the access transistor P13 is connected to the storage node 13, and is further connected to the gate electrode 20 of the drive transistor N15 via the storage node 13. The diffused region (drain) of the drive transistor N15 is connected to the gate electrode of the drive transistor N16 whereas the diffused region (drain) of the drive transistor N16 is connected to the gate electrode of the drive transistor N15 and to the storage node 14.

Next, a method for fabricating the conventional load-less four-transistor memory cell will be described with reference to FIGS. 5A to 5E, which show, at the section along line A–A' of FIG. 3, consecutive steps of fabrication of the conventional load-less four-transistor memory cell.

First, as illustrated in FIG. 5A, a device isolation trench 21 is formed in a predetermined region of a semiconductor substrate 20 by using a conventional selective oxidization method or a trench isolation technique. Subsequently, a gate insulation film 22 made of silicon oxide (SiO$_2$) is formed in a region other than the device isolation trench 21 by using an oxidization technique.

Then, as illustrated in FIG. 5B, gate electrodes 18 and 19 are formed in predetermined locations by using a CVD technique and a photolithographic technique. A well formation step ox an ion injection step for controlling the threshold voltage of the transistor may be performed prior to the gate electrode formation step.

Then, as illustrated in FIG. 5C, an interlayer dielectric film 24, e.g., an oxide film, is formed across the entire surface of the semiconductor substrate 20, and contact holes 25 are formed at predetermined positions by a photolithographic technique and an etching technique.

Then, as illustrated in FIG. 5D, contact plugs 26 are formed in the contact holes 25 by using a CVD technique and an etching technique.

Finally, as illustrated in FIG. 5E, an interconnect layer 27 is formed, thereby completing a sequence of fabrication steps.

As for the connection among the various elements, one or more additional wiring layers may optionally be formed so as to provide multi-layer interconnection structure.

The four-transistor memory cell described in Japanese Patent Laid-Open Publication No. 6-104405 eliminates the need for provision of the resistive loads. In order to hold the data stored in the memory cell, an intermediate potential is applied to the gate of the access transistor so that the access transistor operates as a load resistance during a standby mode of the memory cell. This is achieved by intentionally increasing the OFF-current of the access transistor.

In Japanese Patent Laid-Open Publication No. 10-346149, the threshold voltage of the drive transistor is set to be greater than the absolute value of the threshold voltage of the access transistor so as to enable an excellent cell operation during the standby mode. This is because the magnitude of the OFF-current (leakage current) of the drive transistor, or a typical transistor, varies in reverse proportion to the threshold voltage. In other words, the greater the threshold voltage, the smaller the OFF-current flowing from the storage node of the memory cell.

In the conventional load-less four-transistor memory cell, the access transistor used as a load transistor causes some restrictions on the operation of the memory cell, as detailed below.

It is generally known that a so-called "cell ratio", i.e., the current driveability ratio between the drive transistor and the access MOS transistor, should be higher for achieving the operational stability of a memory cell. The cell ratio is generally expressed by the current driveability of the drive transistor divided by the current driveability of the access transistor.

The reduction in the threshold voltage of the access transistor (which causes an increase in the current driveability therefor) in the load-less four-transistor memory cell as described above results in an increase in the threshold voltage of the drive transistor (i.e., a reduction in the current driveability therefor). This decreases the cell ratio. The current driveability as used herein means the magnitude of the ON-current of the transistor.

In order to avoid the reduction of the cell ratio, the current driveability of the access transistor may be reduced by, for example, reducing the width thereof, or the current driveability of the drive transistor may be increased by, for example, increasing the transistor width thereof.

However, if the current driveability of the access transistor is reduced, it will be difficult to achieve a high-speed operation. On the other hand, if the width of the drive transistor is increased, the memory cell area will be increased.

SUMMARY OF THE INVENTION

In view of the above problems in the four-transistor memory cell of the conventional memory device, it is an object of the present invention to provide a memory cell, used in a semiconductor memory device, having four-transistor, which is capable of realizing a stable and high-speed operation of the memory cell, while eliminating the need for providing resistive load elements in the memory cell and without increasing the size of the memory cell.

The present invention provides, in a first aspect thereof, a memory cell in a semiconductor memory device, including a pair of drive MIS transistors having a first conductivity type, the drive MIS transistors forming a data latch for storing data on a pair of storage nodes, and a pair of access MIS transistors having a second conductivity type, the access MIS transistors responding to an access signal to transfer data between the data storage nodes and a pair of signal lines, each of the drive MIS transistors including a first gate insulation film having a thickness smaller than a thickness of a second gate insulation film of each of the access MIS transistors.

The present invention also provides, in a second aspect thereof, a method for forming a memory cell having a pair of drive MIS transistors having a first conductivity type and a pair of access MIS transistors having a second conductivity type, the method comprising the steps of: separating a region of a semiconductor substrate into a plurality of device areas, forming a first gate insulation film on the device areas, selectively removing the first gate insulation film from some of the device areas, forming a second insulation film on the gate first insulation film and on the some of the device areas, and forming the drive MIS transistors each having a gate on the second gate insulation film and the access MIS transistors each having a gate on a combination of the first and second gate insulation films.

In accordance with the memory cell of the present invention and the memory cell fabricated by the method of the present invention, since the drive transistors have gate insulation films having smaller thickness compared to the gate insulation films of the access transistors, it is possible to realize a stable and high-speed memory cell operation while eliminating the need for load elements, without increasing the memory cell size.

DETAILED DESCRIPTION OF THE PREFERRED EMBODIMENTS

Figure 1A:
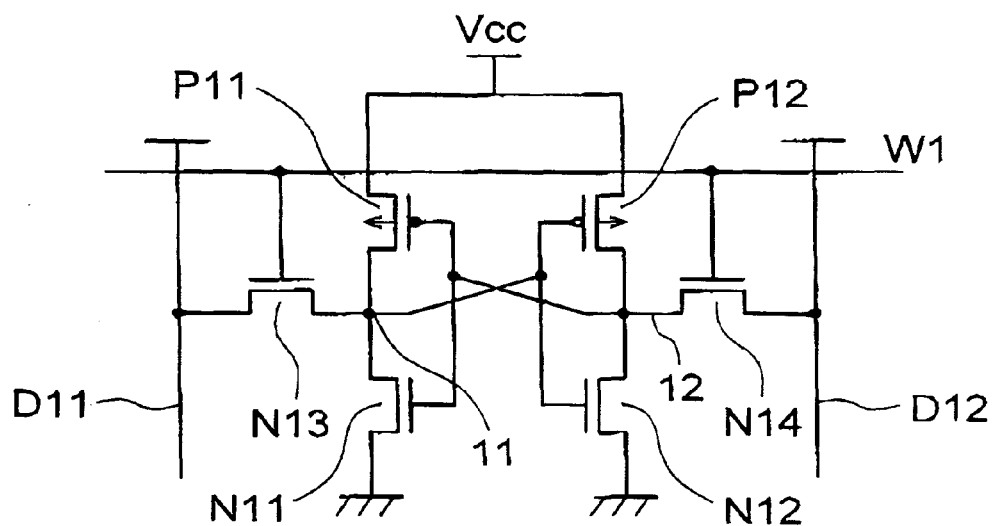
FIGS. 1A and 1B are circuit diagrams illustrating a six-transistor memory cell and a load-less four-transistor memory cell, respectively.

Now, the present invention is more specifically described with reference to accompanying drawings, wherein similar constituent elements are designated by similar reference numerals throughout the drawings.

FIRST EMBODIMENT

Figure 1B:
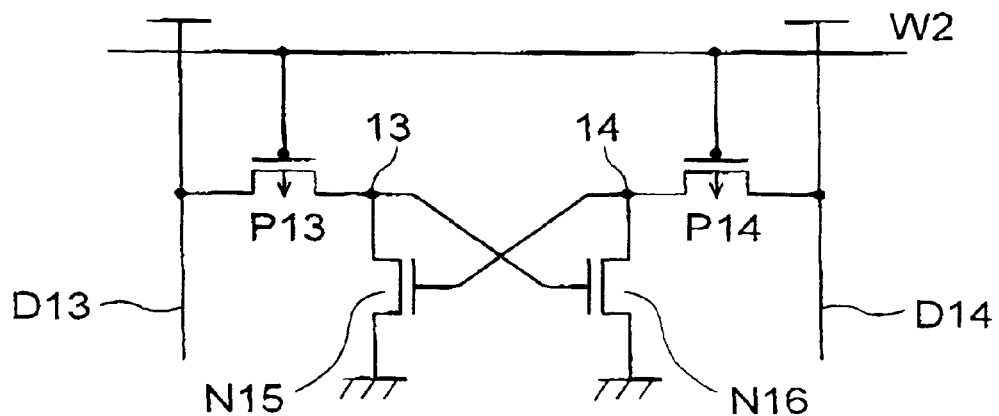
Figure 2A:
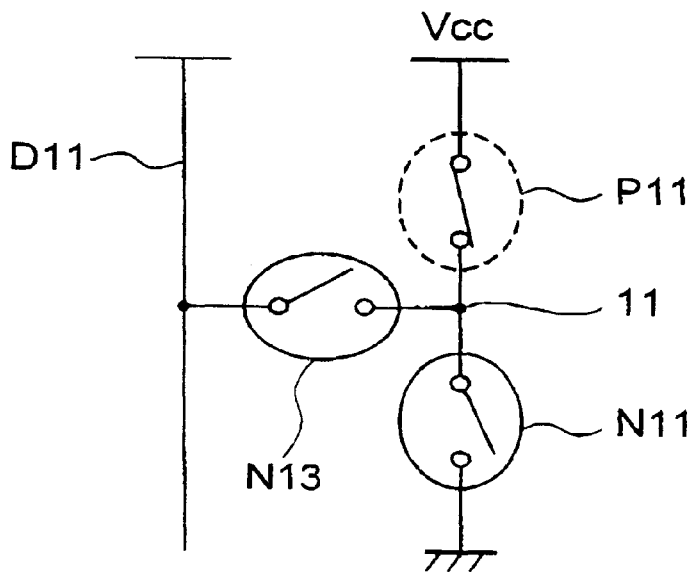
FIGS. 2A and 2B are diagrams illustrating operations of the six-transistor memory cell and the load-less four-transistor memory cell, respectively.
Figure 2B:
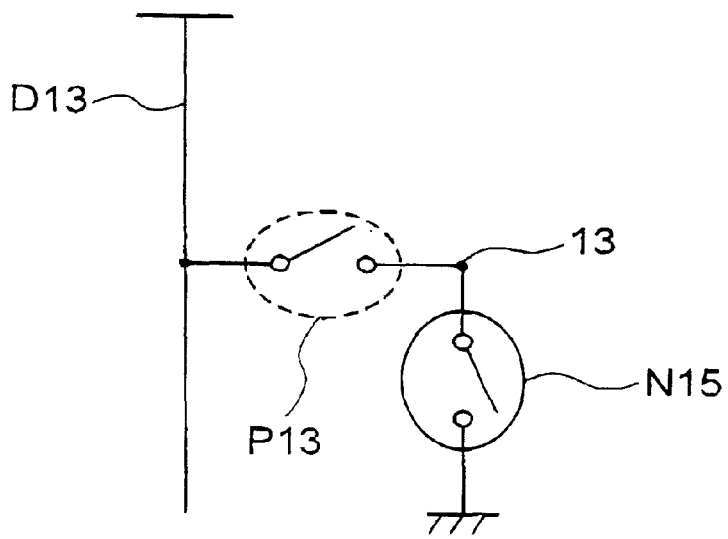
Figure 3:
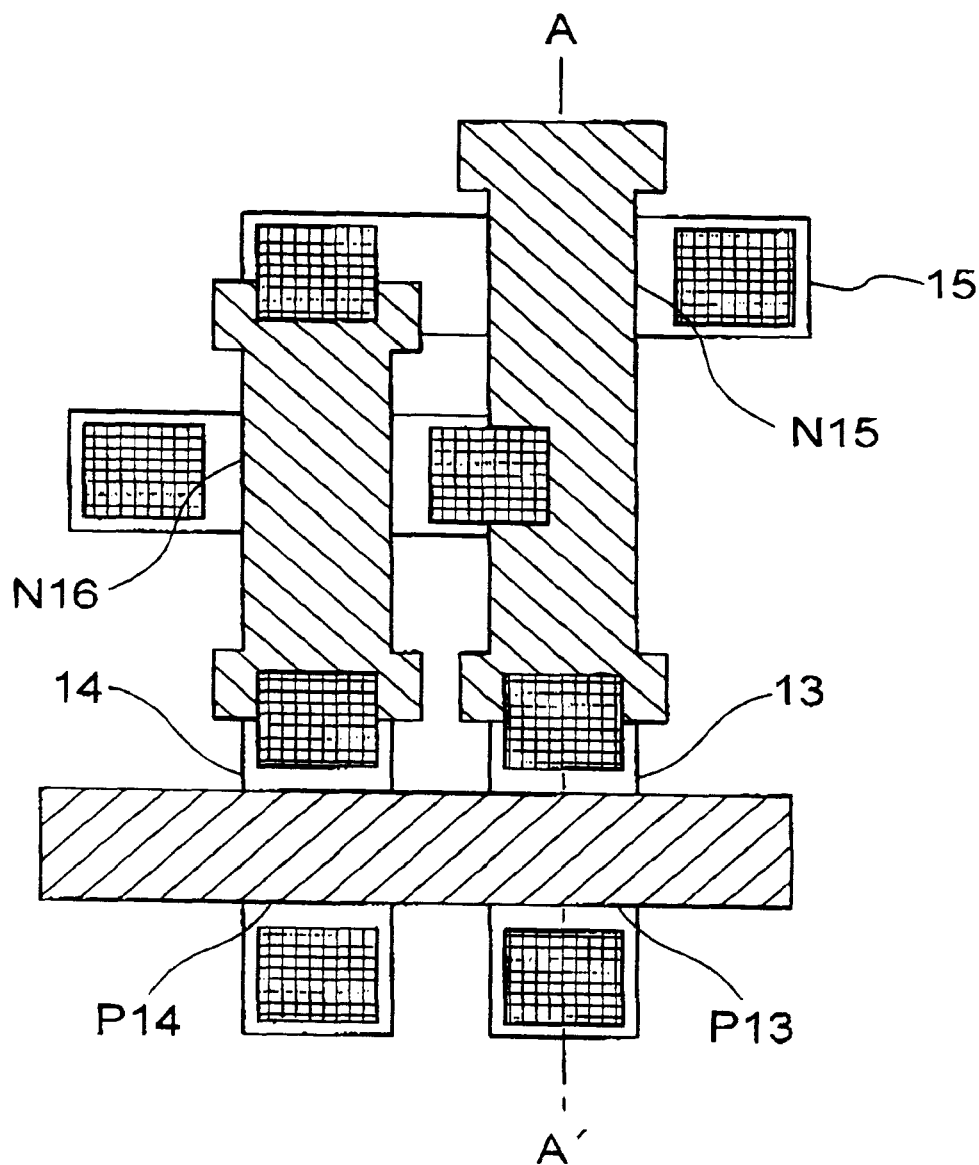
FIG. 3 is a top plan view of the elements of the conventional load-less four-transistor memory cell.
Figure 4:
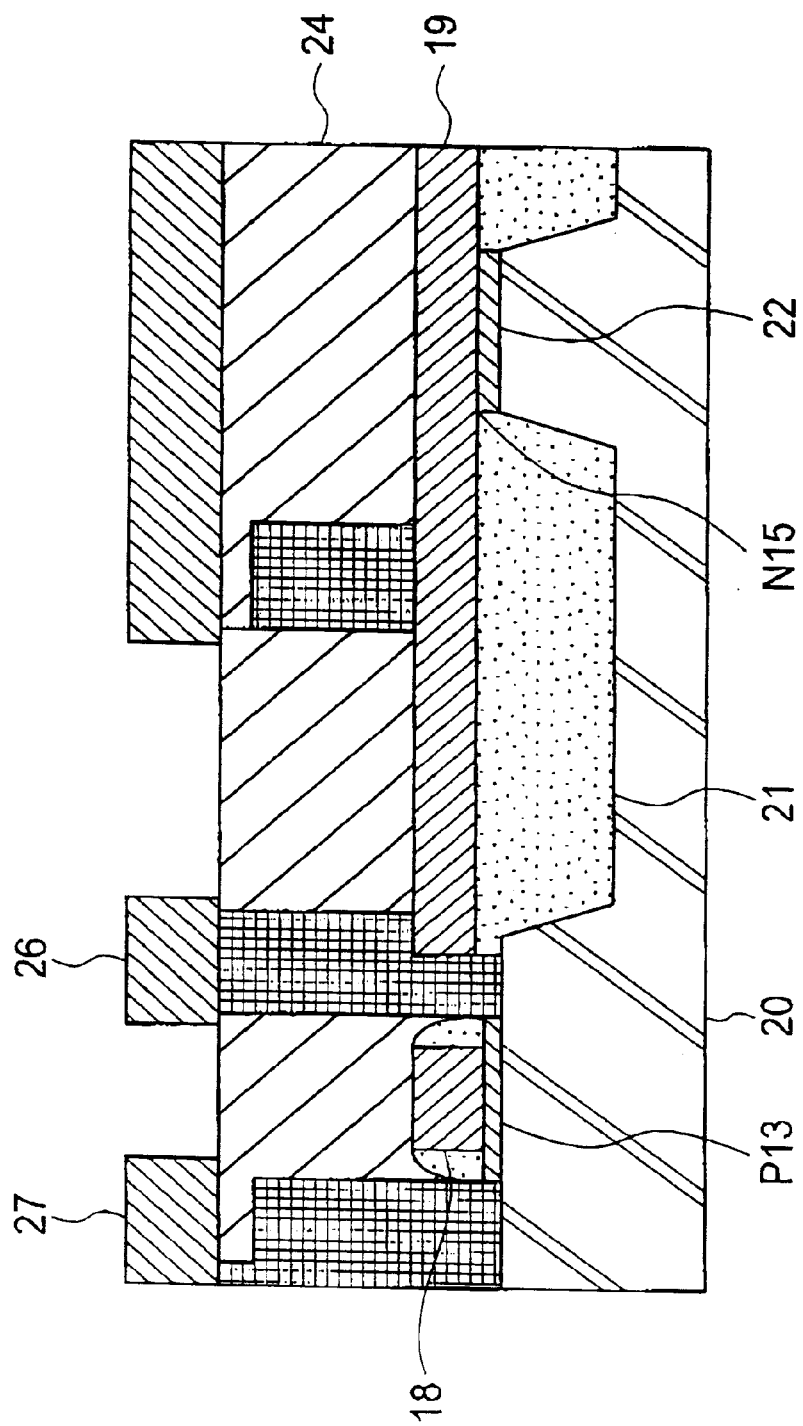
FIG. 4 is a sectional view illustrating the conventional load-less four-transistor memory cell, and taken along line A–A' of FIG. 3.
Figure 5A:
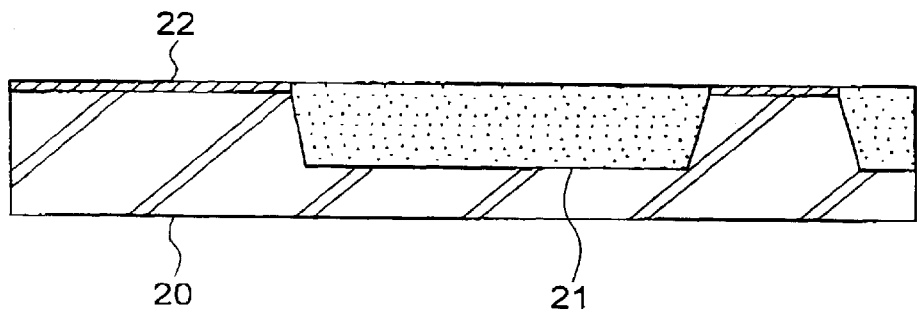
FIGS. 5A to 5E are sectional views, taken along line A–A' of FIG. 3, sequentially illustrating consecutive steps in the process of fabrication of the conventional load-less four-transistor memory cell.
Figure 5B:
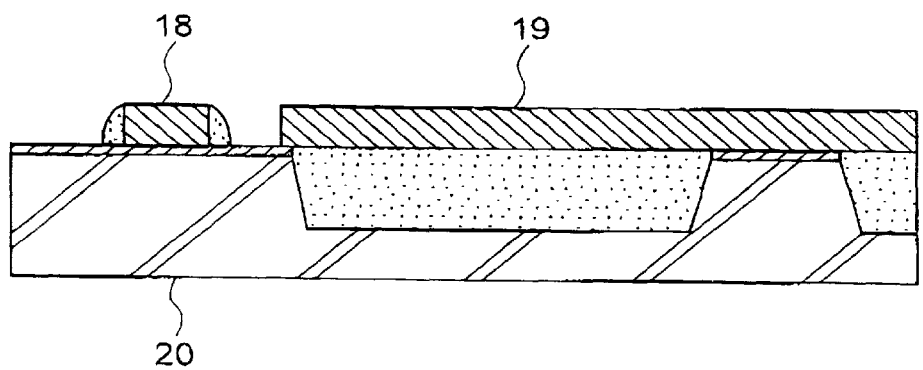
Figure 5C:
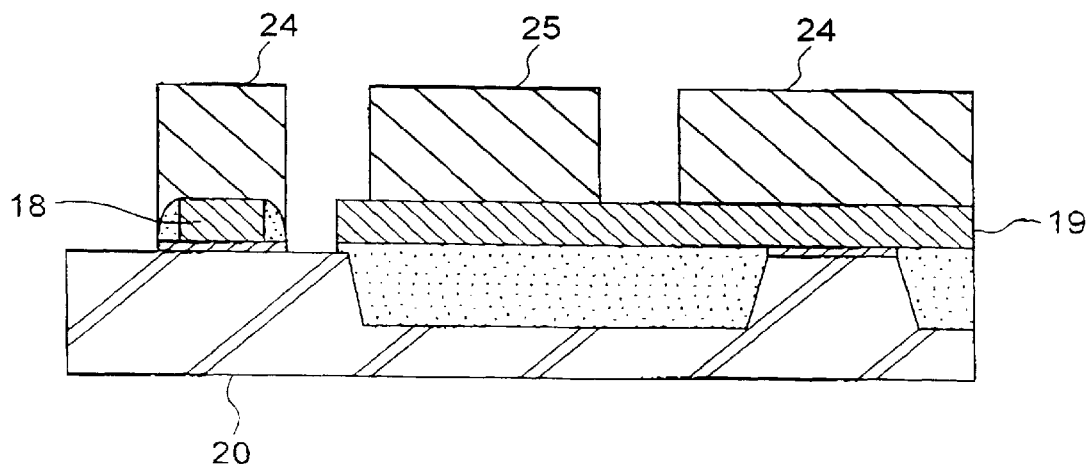
Figure 5D:
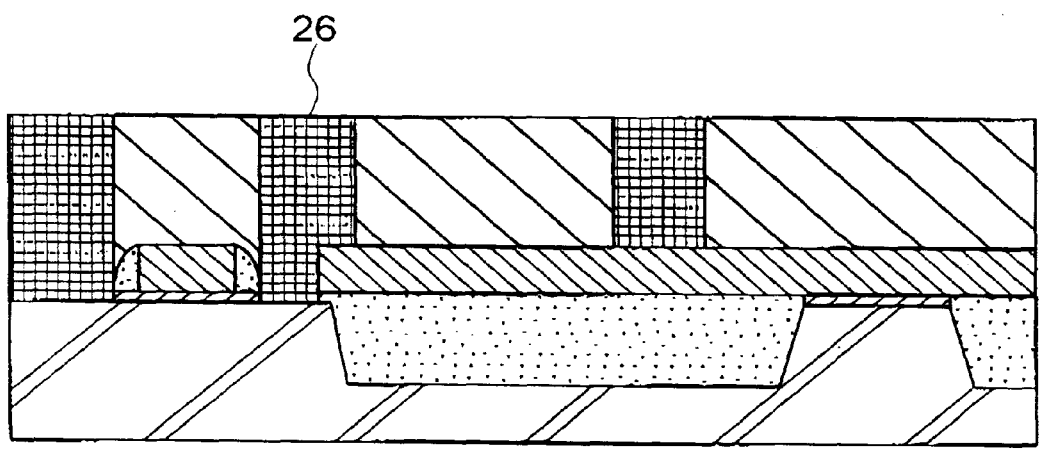
Figure 5E:
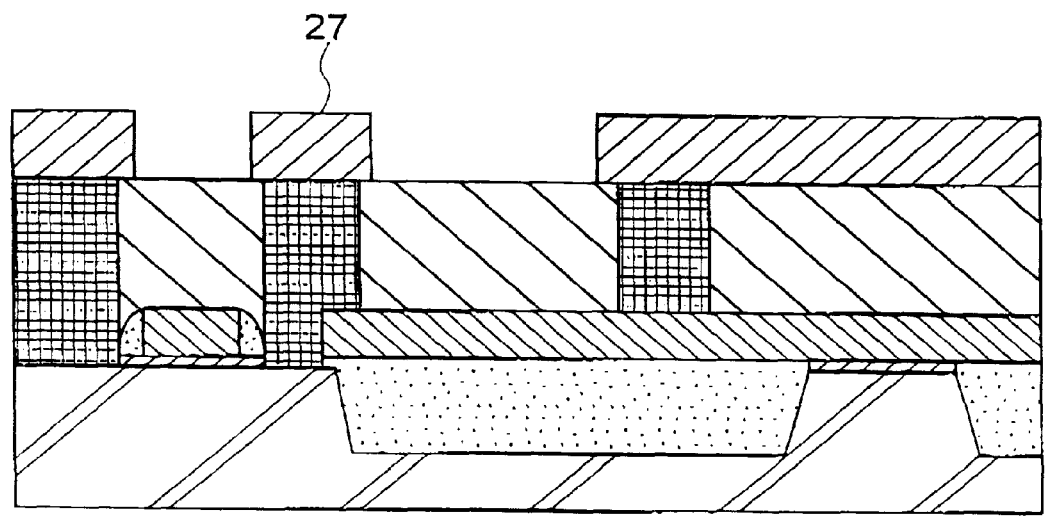
Figure 6:
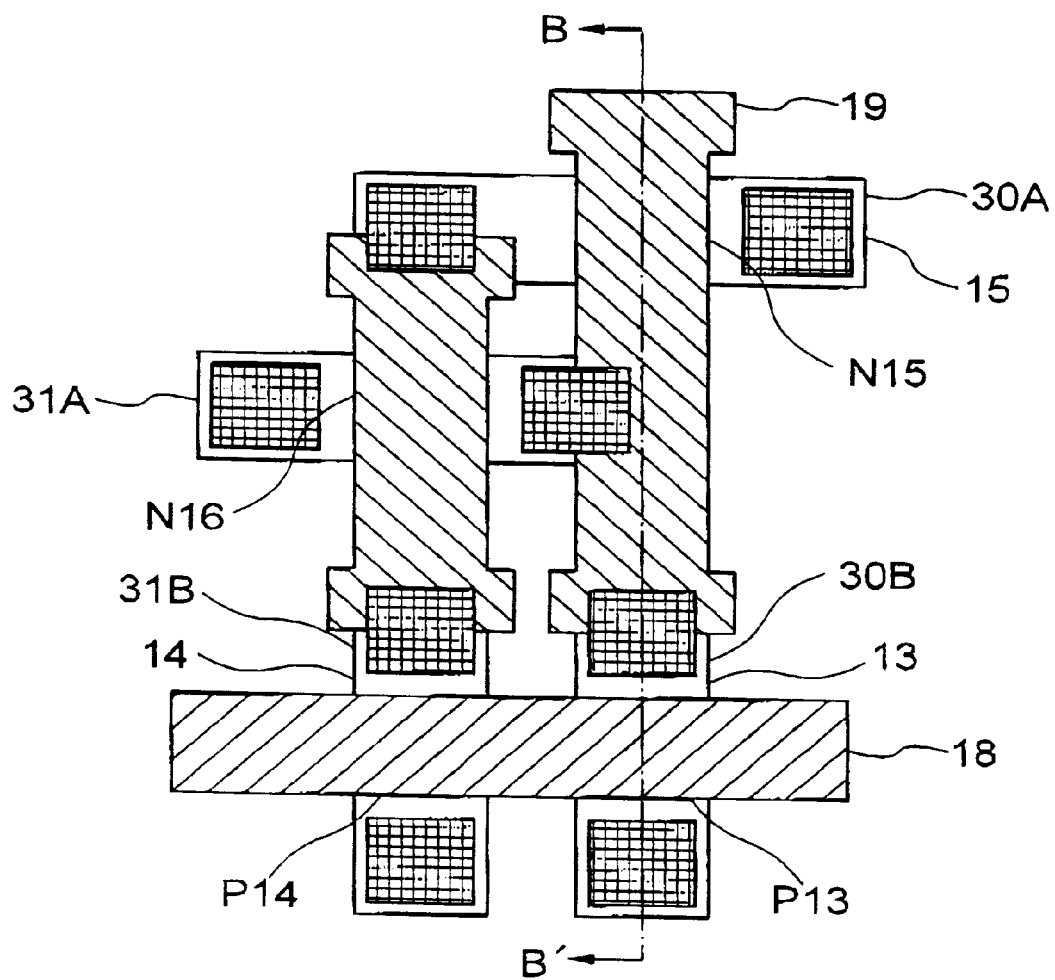
FIG. 6 is a top plan view illustrating an arrangement of elements of a semiconductor memory device according to a first embodiment of the present invention.
Figure 7:
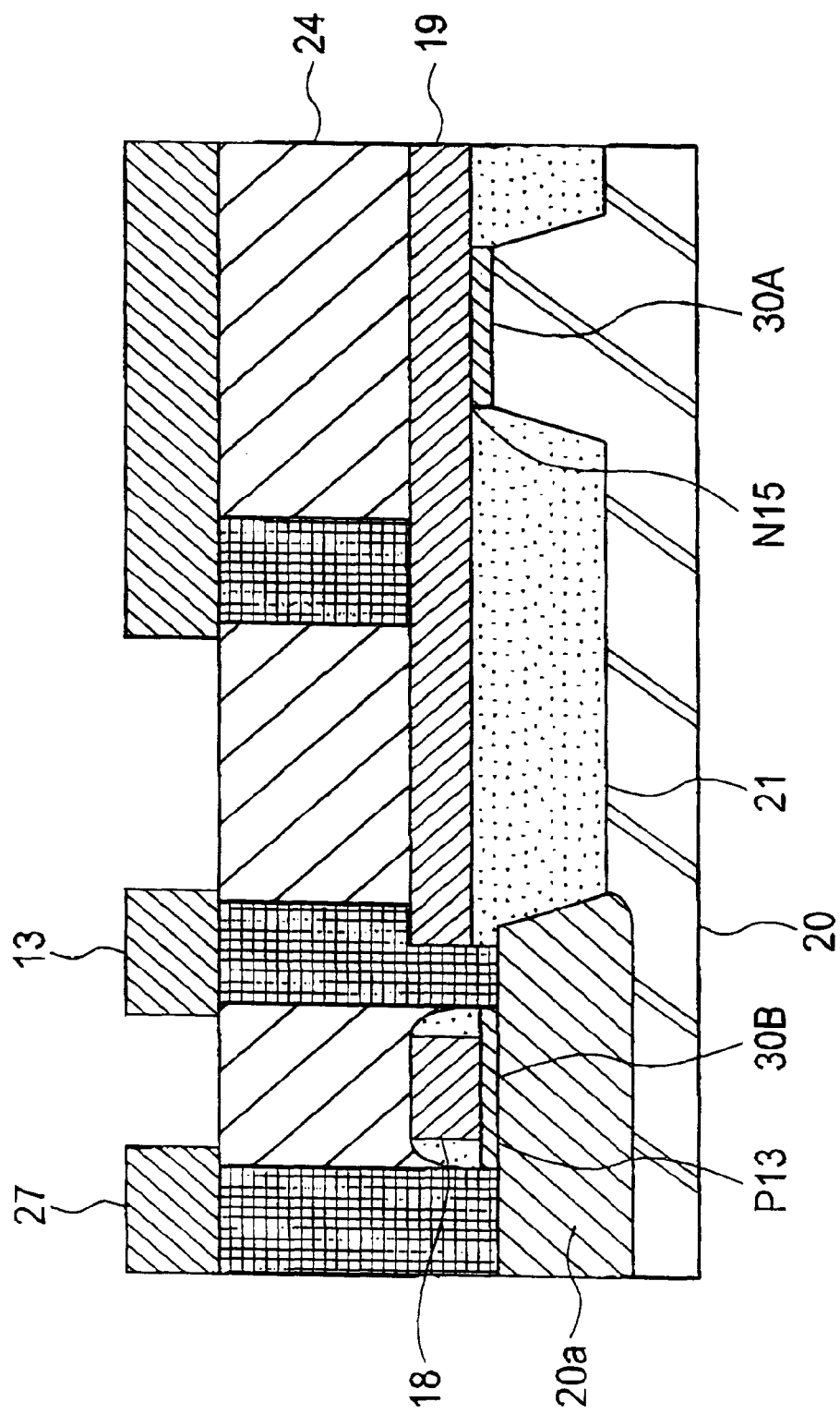
FIG. 7 is a sectional view illustrating the semiconductor memory device of FIG. 6 and taken along line B–B' of FIG. 6.

Referring to FIGS. 6 and 7, a memory cell in a semiconductor memory device according to the first embodiment of the present invention includes four transistors formed on a silicon substrate 20, and no resistive load thereon. The circuit configuration is identical to that shown in FIG. 1B. More specifically, the memory cell includes a pair of drive nMOS transistors N15 and N16 having a pair of storage nodes 13 and 14, and a pair of access pMOS transistors P13 and P14. The access transistor P13 (P14) has a source connected to a digit line D13 (D14), a drain connected to the drain of the drive transistor N15 (16) and the gate of drive transistor N16 (N15) through the storage node 13 (14), and a gate connected to the word line W1. The source of the drive transistor N15 (N16) is connected to the ground. The semiconductor memory device includes an array of such memory cells.

The drive transistors N15 and N16 have gate insulation films 30A and 31A, respectively, overlying channel regions; and access transistors P13 and P14 have gate insulation films 30B and 31B, respectively, overlying channel regions. The storage node 13 (14) connects together the drain of the access transistor P13 (P14), the gate of the drive transistor N16 (N15) and the drain of the drive transistor N15 (N16).

In the present embodiment, the thickness of the gate insulation films 19 of the drive transistors N15 and N16 is smaller than the thickness of the gate insulation films 18 of the access transistors P13 and P14 by a range between 0.5 nm and 2.0 nm.

In FIG. 7, the drain of the access transistor P13 is connected through the contact plug 26 to the storage node 13 and to the gate electrode of the drive transistor N16, and connected to the drive transistor N15 through the contact plug 26.

The relationship between the thickness of the gate insulation film of a MIS transistor and the OFF-current thereof will be specifically described with reference to a MOS transistor as an example of the typical MIS transistor.

As described above, the OFF current of the MOS transistor varies in reverse proportion to the threshold voltage thereof. Moreover, the OFF-current of the MOS transistor is largely dependent upon the sub-threshold characteristics thereof, particularly upon the sub-threshold coefficient (Sub-threshold Swing or S-coefficient).

The sub-threshold coefficient represents a characteristic of the drain current for a low gate voltage, and is defined as a gate voltage that is necessary for increasing the drain current by an order of magnitude. Thus, the sub-threshold coefficient S is represented by S=$\Delta$Vgs/$\Delta$log Id, wherein Vgs denotes the gate voltage, and Id denotes the drain current.

Figure 8:
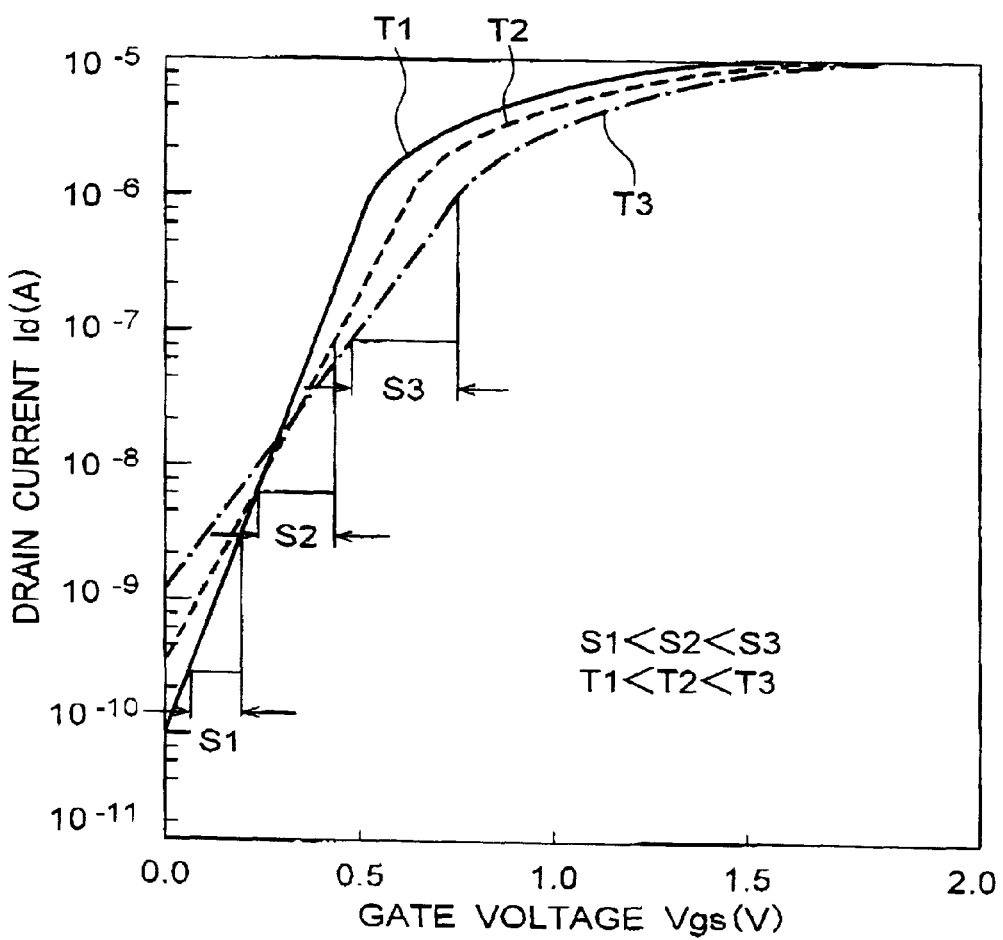
FIG. 8 is a graph illustrating the relationship between the gate voltage Vgs and the drain current ID, with the thickness of the gate insulation film being a parameter.

FIG. 8 depicts the relationship between the gate voltage and the drain current, with the thickness of the insulation film being as a parameter. Specifically, the graph illustrates the sub-threshold characteristics S1, S2 and S3 of the drain current Id and the gate voltage Vds for three different gate oxide films having different thicknesses T1, T2 T3 wherein T1<T2<T3 The sub-threshold coefficients Si, S2 and S3 correspond to the thickness T1, T2 and T3, respectively, of the gate insulation film. The three transistors have substantially the same dimensions.

As will be understood, a smaller thickness of the gate oxide film provides a smaller sub-threshold coefficient S and a smaller OFF-current of the MOS transistor, the OFF-current being the drain current at a gate voltage of zero volt with respect to the source potential. Thus, a larger thickness of the gate insulation film provides a larger sub-threshold coefficient and a larger OFF-current.

Next, the relationship between the thickness of the gate oxide film and the breakdown voltage therefor will be described. As is well known in the art, a dielectric breakdown is more likely to occur as the thickness of the gate oxide film decreases. In other words, with a constant voltage being applied to the gate electrode, a dielectric breakdown is more likely to occur as the thickness of the gate oxide film decreases. Thus, a higher voltage can be applied to the gate electrode by increasing the thickness of the gate insulation film.

As is well known in the art, a MOS transistor, with a high gate voltage being applied thereto, can generate a large drive current.

Therefore, in the load-less four-transistor memory cell of the present embodiment, the OFF-current of the access transistor can be increased to be larger than the current of the drive transistor by increasing the thickness of the gate oxide film of the access transistor (PMOS transistor), without having to change the dimensions of the transistors used. Thus, it is possible to realize a stable memory cell operation without increasing the size of the memory cell.

SECOND EMBODIMENT

A semiconductor memory device according to a second embodiment of the present invention has a configuration such that the each access transistor in the four-transistor memory cell has a gate insulation film having a larger thickness. The larger thickness of the gate insulation film of the access transistor (PMOS transistor) allows a higher voltage to be applied thereto, and thus allows a stable and higher speed operation without increasing the memory cell size for the load-less four-transistor memory cell.

A method for fabricating a semiconductor memory device according to an embodiment of the present invention will now be described. FIGS. 9A to 9E are sectional views taken along line B–B' of FIG. 6, sequentially illustrating the consecutive steps for fabrication of the memory cell of FIG. 6.

Figure 9A:
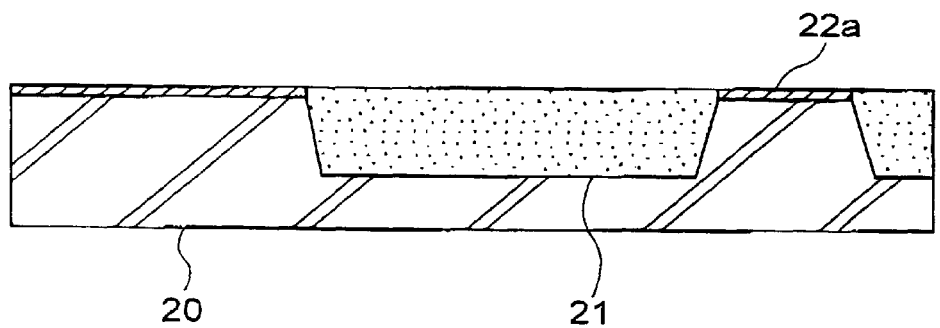
FIGS. 9A to 9E are sectional views taken along line B–B' of FIG. 6, sequentially illustrating consecutive steps in the process of fabrication of the semiconductor memory device of FIG. 6 according to a first example of the method of the present invention.

First, as illustrated in FIG. 9A, a device isolation trench 21 is formed in predetermined regions of a semiconductor substrate 20 by using a conventional selective oxidization method or a trench isolation technique. Subsequently, a first gate insulation film 22a made of silicon oxide (SiO$_2$) is formed in a region other than the device isolation trench 21 by using an oxidization technique.

Figure 9B:
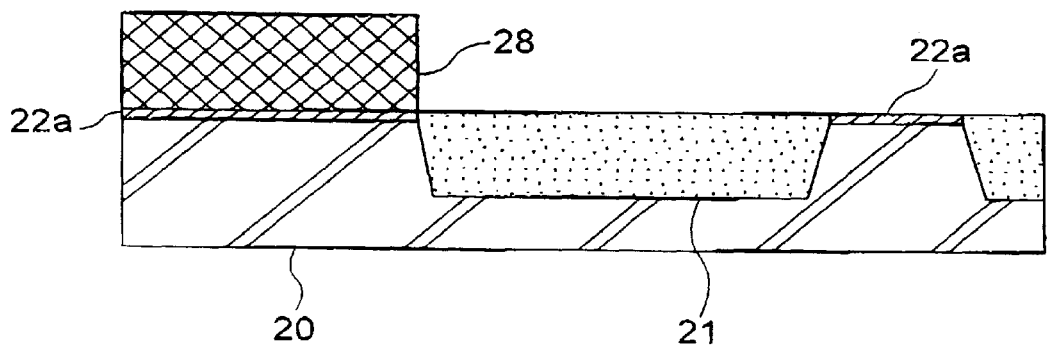

Then, as illustrated in FIG. 9B, a resist mask 28 is formed by using a photolithographic technique. The resist mask 28 is selectively removed so as to expose the memory cell region while covering at least a region where the access transistor is to be formed later. In this step, the resist mask 28 may be formed in regions other than the memory cell region.

Figure 9C:
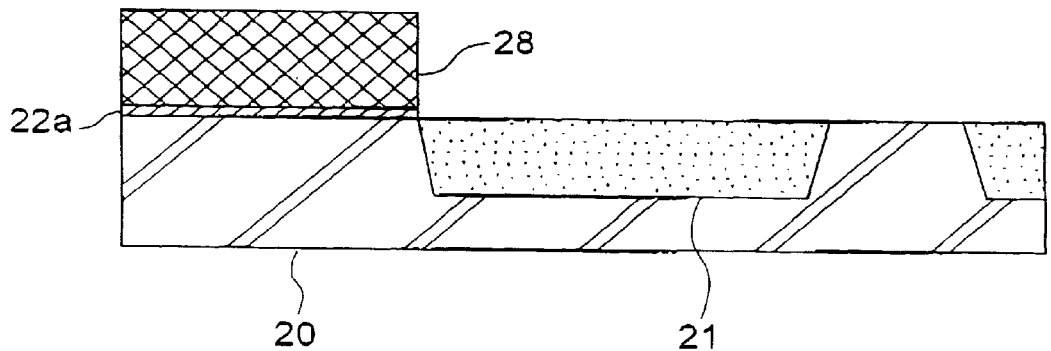

Then, as illustrated in FIG. 9C, the exposed portion of the first gate insulation film 22a is selectively removed by using the resist mask 28 as an etching mask, and then the resist mask 28 is removed.

Figure 9D:
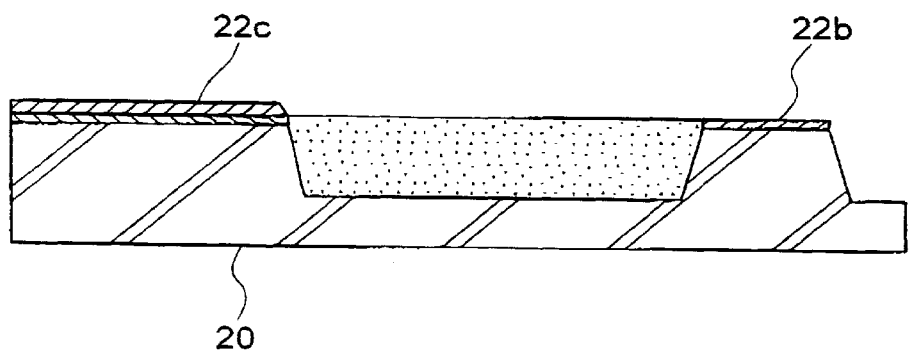
Figure 9E:
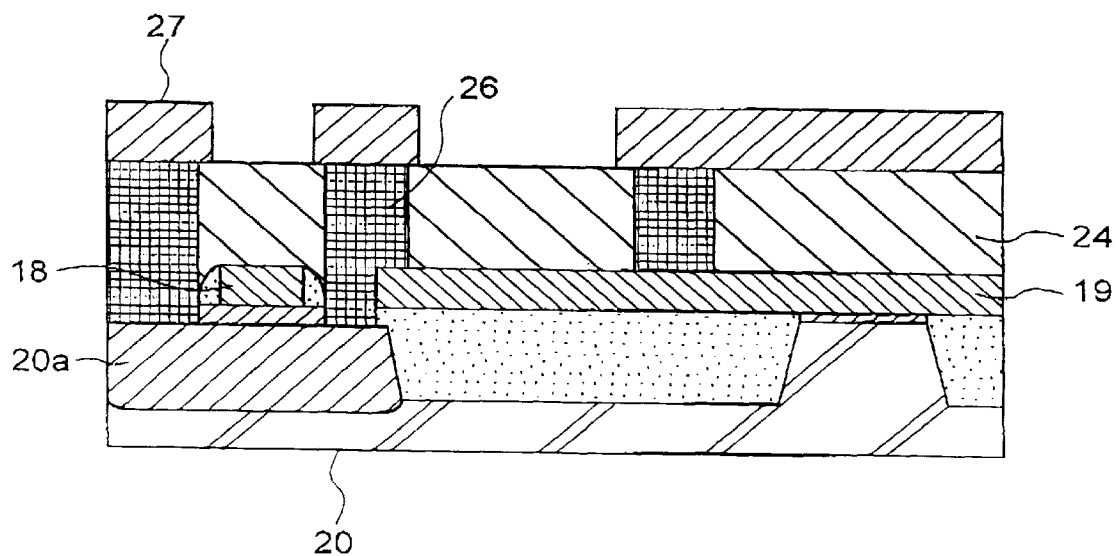

Thereafter, as illustrated in FIG. 9D, a second gate insulation film 22b and a third gate insulation film 22c are formed on the main surface of the semiconductor substrate 20 by using an oxidization technique. The third gate insulation film 22c is obtained by further oxidizing the first gate insulation film 22a. Typically, the thicknesses of the gate insulation films have the following relationship: thickness of third gate insulation film 22c>thickness of first gate insulation film 22a thickness of second gate insulation film 22b.

Subsequently, as illustrated in 9E, a gate electrode 23 is formed in a predetermined region by using a CVD technique and a photolithographic technique. A well formation step for forming the well 20a in the substrate 20 for receiving therein the drive transistors or an ion injection step for controlling the threshold voltage of the transistors may be performed prior to the gate electrode formation step.

Then, an interlayer dielectric film 24, e.g., an oxide film, is formed across the entire surface of the semiconductor substrate 20, and a contact plug 26 is formed in a predetermined location. Finally, an interconnect layer 27 is formed, thereby completing a sequence of fabrication steps.

As for the connection among the various elements, one or more additional interconnect layers may be formed so as to provide multi-layer interconnection structure.

A second method for fabricating the semiconductor memory device of the present embodiment will low be described. FIGS. 10A to 10D are sectional views taken along line B–B' of FIG. 6, sequentially illustrating consecutive steps in the process for fabrication.

Figure 10A:
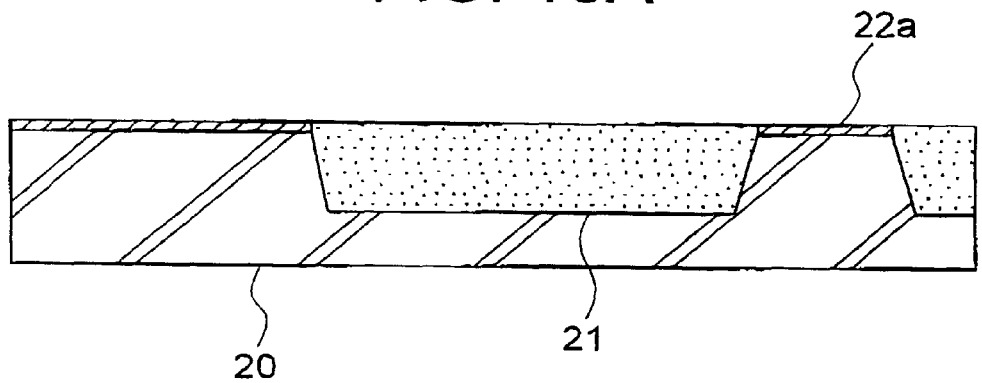
FIGS. 10A to 10D are sectional views taken along line B–B' of FIG. 8, sequentially illustrating consecutive steps in the process of fabrication of the semiconductor memory device of FIG. 6 according to a second example of the method of the present invention.

First, as illustrated in FIG. 10A, a device isolation trench 21 is formed in a predetermined region of a semiconductor substrate 20 by using a conventional selective oxidization method or a trench isolation technique.

Subsequently, a first gate insulation film 22a made of an oxide film (SiO$_2$) is formed in a region other than the device isolation trench 21 by using an oxidization technique.

Figure 10B:
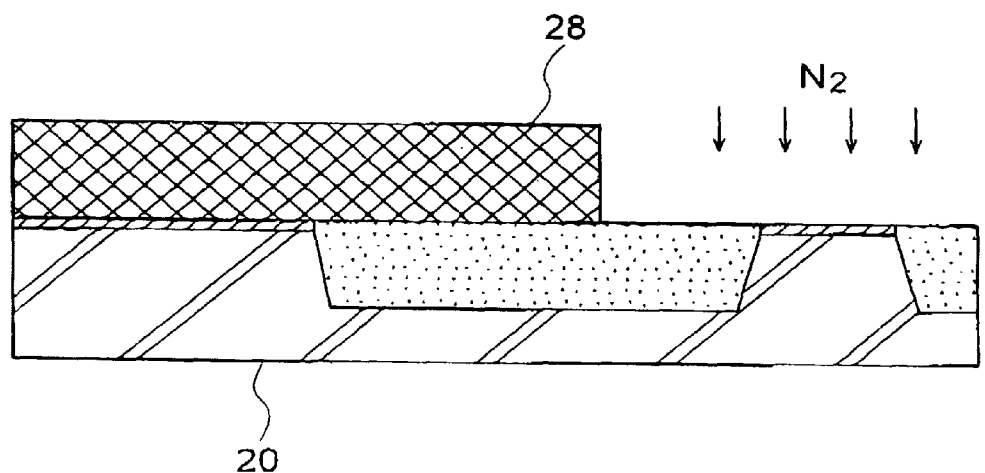

Then, as illustrated in FIG. 10B, a resist mask 28 is formed by using a photolithographic technique. The resist mask 28 is selectively removed so as to expose the memory cell region while covering at least a region where the access transistor is to be formed later. In this step, the resist mask 28 may be formed in regions other than the memory cell region.

Then, elements which inhibit or suppress the growth of an insulation film, such as N$_2$ 29, is ion-implanted into a predetermined region. Although N$_2$ is used in the second method of the present embodiment, the elements may be any other elements so long as they inhibit or suppress the growth of the insulation film. For example, Si, O$_2$, Ta, etc., can be used instead of N$_2$. Then, the resist mask 28 is removed.

Figure 10C:
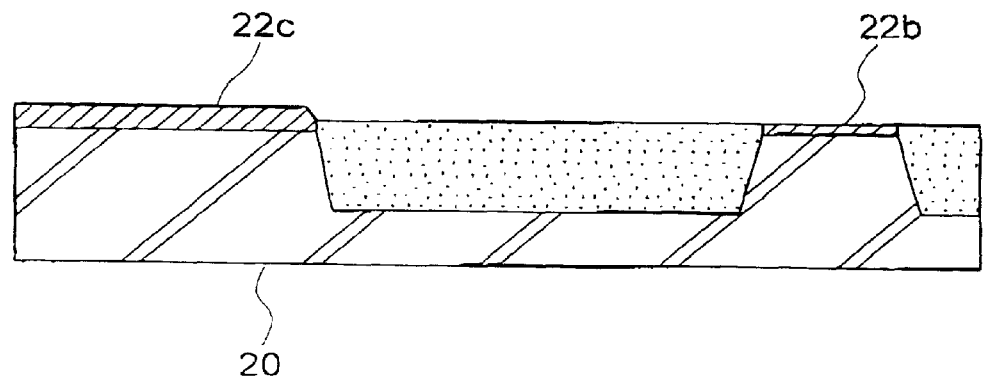

Thereafter, as illustrated in FIG. 10C, a second gate insulation film 22b and a third gate insulation film 22c are formed on the main surface of the semiconductor substrate 20 by using an oxidization technique. The third gate insulation film 22c and the second gate insulation film 22b are obtained by further oxidizing the first gate insulation film 22a.

Because the elements that suppress the growth of the insulation film are ion-implanted through the second gate insulation film 22b, the thickness of the second gate insulation film 22b is preferably smaller than the thickness of the third gate insulation film 22c.

Thus, the thicknesses of the gate insulation films have the following relationship: thickness of the third gate insulation film 22c>thickness of the second gate insulation film 22b thickness of the first gate insulation film 22a.

Figure 10D:
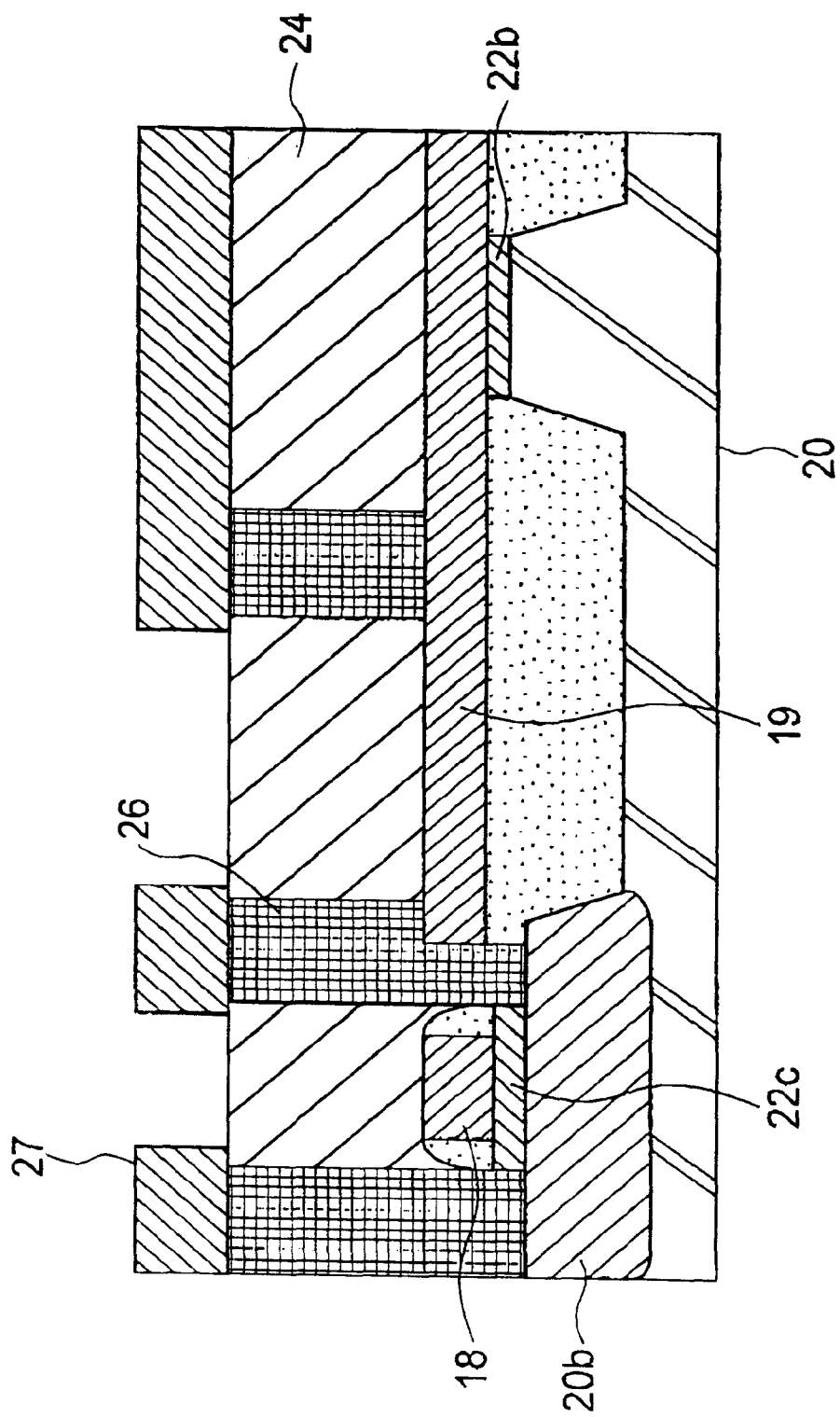

Then, as illustrated in FIG. 10D, a gate electrode 23 is formed in a predetermined region by using a CVD technique and a photolithographic technique. A well formation step for forming wells 22b in the semiconductor substrate 20 for receiving therein the access transistors or an ion injection step for controlling the threshold voltage of the MOS transistors may be performed prior to the gate electrode formation step.

Then, an interlayer dielectric film 24, e.g., an oxide film, is formed across the entire surface of the semiconductor substrate 20, and a contact plug 26 is formed in a predetermined location. Finally, an interconnect layer 27 is formed, thereby completing a sequence of fabrication steps.

As for the connection among the various elements, one or more additional interconnect layers may optionally be formed so as to provide multi-layer interconnection structure.

As described above, in the semiconductor memory devices according to the first and second embodiments of the present invention, the thickness of the gate insulation film of the pair of access MOS transistors is larger than that of the gate insulation film of the pair of drive transistors. As a result, without changing the size of the transistors, the OFF-current of the access MOS transistor is increased, so that a voltage greater than that applied to the gate electrode of the drive transistor can be applied to the gate electrode of the access MOS transistor, thereby facilitating a high-speed operation. Thus, the present invention provides an advantageous effect that it is possible to realize a stable and high-speed memory cell operation while eliminating the need for load elements, without increasing the memory cell size.

Since the above embodiments are described only for examples, the present invention is not limited to the above embodiments and various modifications or alterations can be easily made therefrom by those skilled in the art without departing from the scope of the present invention.

What is claimed is:

1. A method for forming a memory cell having a pair of drive MIS transistors having a first conductivity type and a pair of access MIS transistors having a second conductivity type, said method comprising the steps of: separating a region of a semiconductor substrate into a plurality of device areas, forming a first gate insulation film on said device areas, selectively removing said first gate insulation film from some of said device areas, forming a second insulation film on said first gate insulation film and on said some of said device areas, and forming the drive MIS transistors each having a gate on said second gate insulation film and the access MIS transistors each having a gate on a combination of said first and second gate insulation films.

2. The method as defined in claim 1, wherein said first gate insulation film having a thickness larger than a thickness of said second gate insulation film.

3. A method for forming a memory cell having a pair of drive MIS transistors having a first conductivity type and a pair of access MIS transistors having a second conductivity type, said method comprising the consecutive steps of: separating a region of a semiconductor substrate into a plurality of device areas, implanting elements having a property for suppressing a growth of gate insulation film into some of said device areas, forming a gate insulation film on said device areas, and forming the drive MIS transistors having said gate insulation film in said some of device areas and the access MIS transistors having said gate insulation film in other device areas other than said some of said device areas.

4. The method as defined in claim 3, wherein said elements are $N_2$.

* * * * *